United States Patent [19]
De Los Santos

[11] Patent Number: 5,808,527
[45] Date of Patent: Sep. 15, 1998

[54] TUNABLE MICROWAVE NETWORK USING MICROELECTROMECHANICAL SWITCHES

[75] Inventor: Hector J. De Los Santos, Inglewood, Calif.

[73] Assignee: Hughes Electronics Corporation, Los Angeles, Calif.

[21] Appl. No.: 771,610

[22] Filed: Dec. 21, 1996

[51] Int. Cl.⁶ .............................. H01P 1/203; H01P 1/10
[52] U.S. Cl. .......................... 333/205; 333/262; 333/263
[58] Field of Search .................... 353/174, 175, 353/202, 204, 205, 207, 235, 263, 101, 105

[56] References Cited

U.S. PATENT DOCUMENTS

| | | | |
|---|---|---|---|
| 3,718,874 | 2/1973 | Cooper, Jr. | 333/204 |
| 3,794,941 | 2/1974 | Templin | 333/17.1 |
| 3,796,976 | 3/1974 | Heng et al. | 333/161 |
| 4,453,145 | 6/1984 | Schuster | 333/174 |
| 5,164,688 | 11/1992 | Larson | 333/263 X |
| 5,644,598 | 7/1997 | Bidese | 333/175 X |

OTHER PUBLICATIONS

Larson, L. E. et al., "Microactuators for GaAs–Based Microwave Integrated Circuits", IEEE Transducers 1991 Conference on Solid State Sensors and Actuators, 1991, pp. 743–746.

Hill, J. C. et al., "PIN Diode Switches Handle High–Power Applications", MSN Technical Feature, Jun. 1989, pp. 36–41.

Shifrin, M. et al., "Monolithic Control Components Handle 27 W of RF Power", Microwave Journal, Dec. 1989 pp. 119–122.

McCreary, J. L. et al., "All MOS Charge Redistribution Analog–to–Digital Conversion Techniques — Part I"Reprint from IEEE Journal of Solid State Circuits, SC–10, pp.371–379. Dec. 1975, pp. 312–316.

Toyoda, Sachihiro, "High Efficiency Single and Push–Pull Power Amplifiers", IEEE MTT–S Digest, 1993, pp. 277–280.

Primary Examiner—Robert J. Pascal
Assistant Examiner—Seungsook Ham
Attorney, Agent, or Firm—Georgann S. Grunebach; Terje Gudmestad; Michael W. Sales

[57] ABSTRACT

A desired frequency response of a microwave network on a monolithic microwave integrated circuit (MMIC), a microwave integrated circuit (MIC), or a hybrid circuit is achieved by selectively switching MEM switches to change the network topology. In a filter network, MEM switches connected between capacitors and inductors are selectively switched to change the network configuration to achieve a desired frequency response. In an amplifier network, the MEM switches are selectively switched to tune the amplifier to a desired frequency response and to reduce harmonic output.

4 Claims, 3 Drawing Sheets

TUNABLE MICROWAVE NETWORK USING MICROELECTROMECHANICAL SWITCHES

BACKGROUND OF THE INVENTION

1. Field of the Invention

This invention relates to the tuning of microwave networks, and more specifically to the tuning of filters and amplifiers using microelectromechanical (MEM) switches on monolithic microwave integrated circuits (MMICS), microwave integrated circuits (MICs) and hybrid circuits.

2. Description of the Related Art

A filter typically includes a network of capacitive and inductive circuits in series, parallel or some combination thereof. When a filter is implemented on a monolithic microwave integrated circuit (MMIC), networks of binary weighted unit capacitors are typically used as capacitive circuits. Binary weighted capacitors are described in J. L. McCreary et al., "All-MOS Charge Redistribution Analog-to-Digital Conversion Techniques—Part I," *IEEE J. Solid-State Circuits,* vol. SC-10, 1975, pages 371-379. A filter network has a frequency response that is determined by its configuration, the capacitance values of its capacitors and the inductance values of its inductors. Because the capacitors and inductors on a MMIC, a MIC or a hybrid circuit are usually fixed, and unlike a waveguide filter which can be tuned by using a tuning screw to change the geometry of at least one of its cavities, a filter based on a MMIC, a MIC or a hybrid circuit is generally not tunable.

Two major types of semiconductor switches, PIN diode and field effector transistor (FET), are used to change a MMIC circuit configuration. PIN diode switches for microwave applications are described in J. C. Hill et al., "PIN Diode Switches Handle High-Power Applications," *MSN,* June 1989, pages 36–40. Microwave FET switches are described in M. Shifrin et al., "Monolithic Control Components Handle 27 W of RF Power," *Microwave Journal,* December 1989, pages 119–122.

In general, PIN diode and FET switches have low isolation when the switch is off and high insertion loss when the switch is on at frequencies beyond the C-band. While PIN diode and FET switches are suitable for microwave operations at relatively low frequencies, many modern satellites operate at higher microwave frequencies in the X-band, Ku-band and Ka-band. These switches have parasitic capacitances and inductances which significantly degrade their performance at these high frequencies, and are therefore not used to reconfigure a MMIC filter for the purpose of tuning.

PIN diode and FET switches are semiconductor devices with P/N junctions that enable the activation of on/off switching and exhibit nonlinear characteristics which generate undesirable intermodulation distortions. Moreover, the nonlinearities also generate undesired output signals at harmonic frequencies, and if the switch is used in a filter network with a poor impedance match, substantial variations in the harmonic signals can be produced, as described in J. C. Hill et al, supra.

The operation of a PIN diode or FET switch requires a continuous power supply to provide a bias voltage, and therefore consumes power even if the switch is in a steady state, that is, when the switch remains either on or off. Many of these switches are usually required for a microwave network on board a satellite, and the power drain from the satellite's batteries for maintaining these switches can result in a shorter operational life span of the satellite.

Tuning of a microwave network to match its impedance to a desired setting for optimal operation traditionally has been achieved by manual tuning, that is, by manually setting the effective electrical length of transmission lines in the network. One example of manual tuning uses a shunt stub, which is a terminated transmission line segment connected in parallel with the main transmission line. The shunt stub has either a short-circuit or an open-circuit termination and its length is adjustable, whereas the length of the main transmission line is usually fixed. Impedance matching is using continuously adjustable shunt stubs is well known and is described in R. E. Collin, *Foundations for Microwave Engineering,* McGraw-Hill, Inc., 1966, pages 207–212.

Manual tuning is not feasible for impedance matching applications in which the microwave network that is to be tuned is not accessible, such as satellite operations. Manual tuning must be completed and the transmission line lengths fixed before the satellite is launched. Thereafter, it is not practical to optimize the performance of the microwave network by further adjusting the transmission line lengths on board the satellite.

To vary the effective electrical length of a transmission line to achieve proper tuning, semiconductor PIN diode switches and/or FET switches are placed along segments of the transmission line and are selectively turned on and off to obtain the desired electrical line length. Harmonic signals, which are generated by a power amplifier's nonlinear amplification characteristics, are at integral multiples of the fundamental frequency, and are usually undesirable in most microwave communication applications and therefore must be reduced. The harmonic signals can be reduced by tuning the effective electrical lengths of transmission lines at input and output ends of the amplifier. A typical semiconductor microwave power amplifier is described in S. Toyoda, "High Efficiency Single and Push-Pull Power Amplifiers," *IEEE MTT-S Digest,* 1993, pages 277–280.

MEM switches are small switching devices activated by an actuation voltage, and are usually manufactured on a semiconductor substrate. Suitable substrates include silicon (Si) and gallium arsenide (GaAs), which are the most common types of semiconductor materials used in MMICs. MEM switches can also be fabricated on substrates of dielectric materials such as alumina, which is used in hybrid circuits. MEM switches for GaAs MMICs are described in L. E. Larson et al., "Microactuators for GaAs-based Microwave Integrated Circuits," *IEEE Transducers '91 Conference on Solid State Sensors and Actuators,* 1991, pages 743–746. The actuation voltage determines whether the switch is in an "on" or "off" state.

One type of MEM switch is the MEM cantilever beam deformable switch, which has a deformable cantilever beam arm that moves to open or close a circuit path and is described in L. E. Larson, et al, supra. The switch is small in size, with typical dimensions on the order of 17.5 microns×125 microns, and can be manufactured on substrates of various materials, such as Si and GaAs. The switch is turned on or off by a voltage signal applied to a static electric switching electrode, which is a conductive layer deposited on the semiconductor substrate and is positioned beneath the beam arm. The switch opens or closes by moving the beam arm in response to the voltage signal. A typical actuation voltage to turn the switch on, that is, to close the circuit path with the movable beam arm, is in the range of about 70–90 volts.

MEM switches have not been used in reconfigurable microwave networks on board a spacecraft because the contact is mechanical and has been considered unstable when subjected to high levels of acceleration and/or vibration.

SUMMARY OF THE INVENTION

In view of the above problems, the present invention provides microwave tuning networks which use MEM switches to selectively change the network topology on a MMIC, a MIC or a hybrid circuit to achieve a desired frequency response. In a network comprising a plurality of inductive lines, MEM switches are connected between the lines to form a reconfigurable inductive circuit. MEM switches can also be implemented in a network of binary weighted unit capacitors to form a reconfigurable capacitive circuit. A filter is formed by combining these reconfigurable capacitive and inductive circuits in a desired network configuration. The frequency response of the filter is tunable by selectively switching at least some of the capacitive and/or inductive circuits to change the circuit configurations.

Numerous other implementations of MEM switch-based tuning networks are also feasible. In a microwave amplifier network, the MEM switches are used to adjust the effective electrical lengths of input and output transmission lines to tune the amplifier to a desired frequency response. The amplifier network can be tuned for a desired frequency response that reduces the harmonics. Connecting a number of shunt stubs of selected lengths at selected locations to the input and output transmission lines changes the input and output impedances of the transmission lines, and results in a change in the frequency response of the amplifier network. Each shunt stub is connected to a transmission line by a MEM switch. By selectively closing MEM switches to some of the shunt stubs while opening others, a desired frequency response for the amplifier network can be obtained.

These and other features and advantages of the invention will be apparent to those skilled in the art from the following detailed description, taken together with the accompanying drawings, in which:

BRIEF DESCRIPTION OF THE DRAWINGS

FIG. 3b is an equivalent circuit diagram of the filter in FIG. 3a;

DETAILED DESCRIPTION OF THE INVENTION

Figure 1:
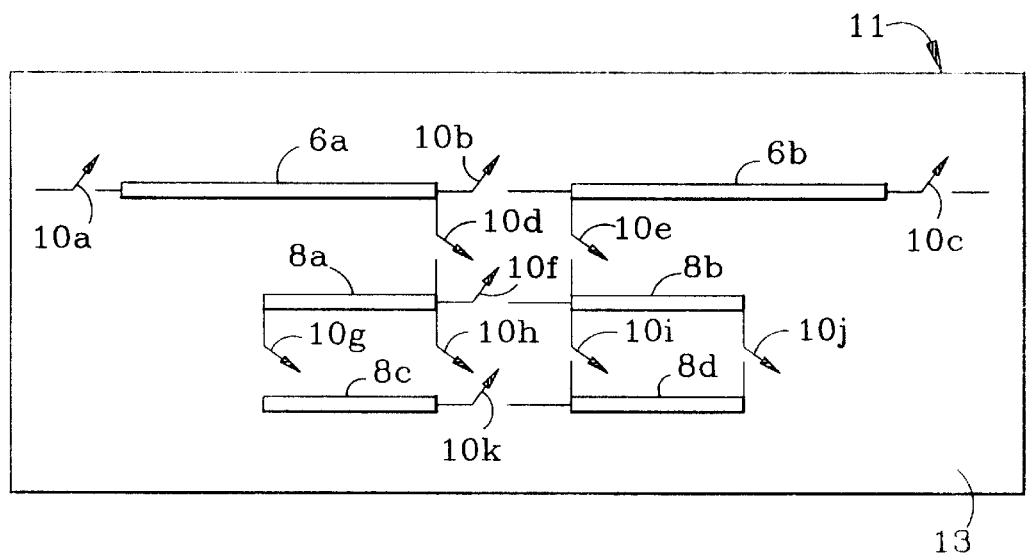
FIG. 1 is a simplified plan view of a reconfigurable inductive line network connected by a plurality of switches on a substrate.

The present invention provides microwave tuning networks using MEM switches that selectively connect different microwave components on the substrate of a MMIC, a MIC or a hybrid circuit to change the network topology for purposes such as producing a desired frequency response. Impedance matching of a transmission line is achieved by placing a number of shunt stubs at desired locations and selectively connecting the shunt stubs to the transmission line with MEM switches. In a microwave amplifier network, the transmission lines connected to the input and output of the amplifier are selectively connected to shunt stubs with MEM switches to tune the amplifier to a desired frequency response. In a tunable microwave filter network, the circuit topology is changed by selectively switching the filter's capacitive and/or inductive circuits with MEM switches to produce a desired frequency response.

MEM switches have several advantages over semiconductor PIN diode or FET switches. The "on" resistance and the "off" capacitance of a typical MEM cantilever beam deformable switch are on the order of 2 ohms and 1.6 femtofarads, respectively. As a result of the low "on" resistance and low "off" capacitance, the insertion loss is as low as about 0.05 dB in the "on" state and the isolation is on the order of 33 dB in the "off" state at a frequency of about 18 GHz. MEM switches generally exhibit much lower "on" resistance and lower "off" capacitance than typical microwave PIN diode or FET switches. When switches are used to adjust the frequency response of a network, it is highly desirable that the switches be as nearly perfect as possible, i.e., nearly zero insertion loss in the "on" state and nearly infinite isolation in the "off" state. Therefore, MEM switches are better suited for reconfigurable microwave networks than semiconductor switches.

MEM switches exhibit excellent switching characteristics with low insertion loss in the "on" state and high isolation in the "off" state, from DC up to high microwave frequencies. A typical MEM switch has less than 0.5 dB insertion loss in the "on" state and greater than 25 dB isolation in the "off" state at frequencies up to about 45 GHz. Therefore, MEM switches are suitable for operations in the X-, Ku- and Ka-bands. Moreover, a MEM switch opens and closes a circuit path by the mechanical motion of its beam arm. There is no P/N junction in a MEM switch, and therefore no nonlinearities are produced by the electrical characteristics of semiconductors. The intermodulation distortions and harmonics generated by a MEM switch are so small that they are negligible for most applications.

A MEM switch consumes less power than a semiconductor PIN diode or FET switch, and does not need a continuous power supply to maintain a bias voltage. Turning on the switch requires an actuation voltage, but this voltage only provides a static electric charge that causes the beam arm to move, and the power required for switching is much less than the continuous power required for a PIN diode or a FET switch. Therefore, MEM switches are suitable for spacecraft applications in which power consumption directly affects the life span of the spacecraft.

FIG. 1 shows an embodiment of the invention in which a tunable inductive line network has a plurality of inductive lines $6a$, $6b$, $8a$, . . . $8d$ connected by a plurality of switches $10a$, $10b$, . . . $10k$, preferably MEM switches, on a microwave circuit 11 that has a substrate 13 of a semiconductor material such as silicon or GaAs, or a dielectric material such as alumina which is used in hybrid circuits. Selective switching of at least some of the MEM switches changes the inductance value of the overall inductive line network, thereby changing its frequency response. In this embodiment, the inductive lines $6a$, $6b$ each have an inductance value $L_1$, and the inductive lines $8a$, . . . $8d$ each have an inductance value $L_2$. If the switches 10a, ... 10c are closed while the switches 10d, ... 10k are open, only the inductive lines 6a, 6b are connected to result in an overall inductance value of $2L_1$. If the switches 10b, 10f, 10h and 10j are open while the switches 10a, 10c, 10d, 10e, 10g, 10i and 10k are closed, the overall inductance of the network is $2L_1+2L_2$. If the switches 10b, 10f, 10h and 10i are open while the switches 10a, 10c, 10d, 10e, 10g, 10j and 10k are closed, the overall inductance of the network is $2L_{b+4}L_2$. Other inductive network configurations are also feasible, and the individual inductive lines may have the same or different inductance values. The inductive line network as a whole can be used as a single adjustable inductor in a filter, with the adjustment made by selected switching of the MEM switches.

Figure 2A:
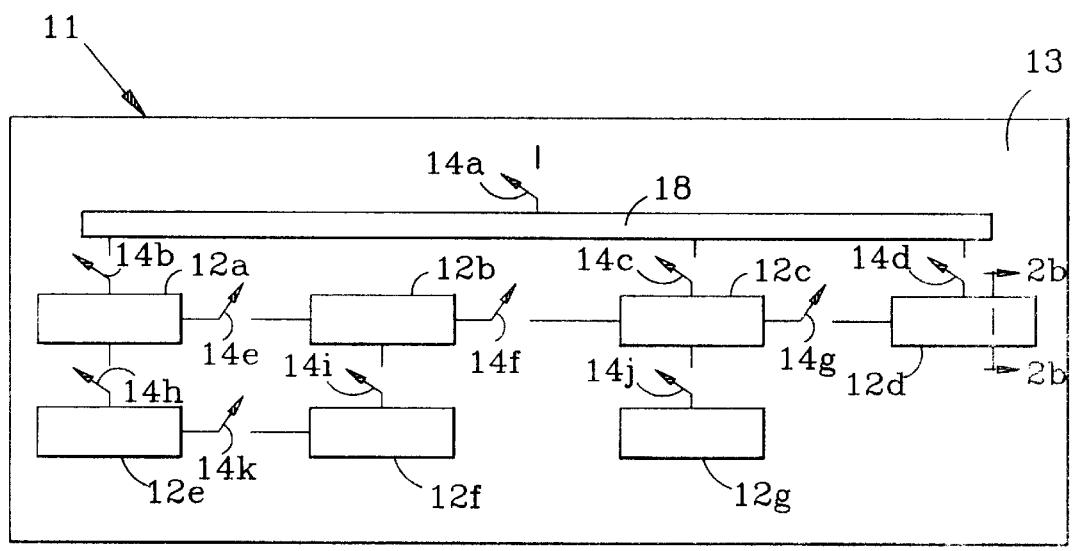
FIG. 2a is a simplified plan view of a reconfigurable binary weighted capacitor network connected by a plurality of switches on a substrate.
Figure 2B:
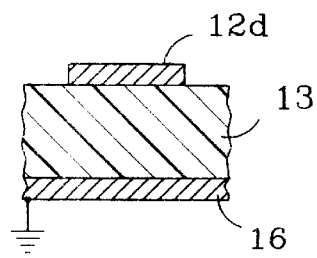
FIG. 2b is a sectional view taken along the section line 2b–2b of FIG. 2a, showing the plates of a binary weighted capacitor.

FIG. 2a shows an embodiment of the invention in which a tunable capacitor network has a plurality of binary weighted capacitors, the top plates 12a, 12b, ... 12g of which are connected by a plurality of switches 14a, 14b, ... 14k, preferably MEM switches, on a microwave circuit 11 that has a substrate 13 of a semiconductor or a dielectric material. A binary weighted capacitor has a cross-section as shown in FIG. 2b, with the top plate 12d positioned on the semiconductor substrate 13, which is positioned on a common ground plane 16. The ground plane 16 is usually grounded, and together with the top plate 12d, functions as parallel plates for the binary weighted capacitor.

The capacitor network as a whole is used as a single adjustable capacitor in a filter on a MMIC, a MIC or a hybrid circuit. Returning to FIG. 2a, the MEM switches 14a, 14b, ... 14k are selectively switchable so that the topology of the capacitor circuit can be reconfigured to change the capacitance value of the overall network, thereby changing its frequency response. In this embodiment, the capacitors 12a, 12b, ... 12g each have a capacitance value $C_1$, and a transmission line segment 18 is connected to the capacitors via the switches 14b, 14c and 14d. Different network capacitances are obtained by connecting some of the capacitors while disconnecting others. For example, to obtain an overall network capacitance of $2C_1$, the switches 14a, 14c and 14j are closed while the switches 14b, 14d, 14e, 14f, 14g, 14h, 14i and 14k are open. To obtain a network capacitance of $4C_1$, the switches 14a, 14b, 14e, 14h, 14i and 14k are closed while the switches 14c, 14d, 14f, 14g and 14j are open. FIG. 2a illustrates only one configuration of a MEM-switch-connected capacitor network; other configurations are also feasible.

Figure 3A:
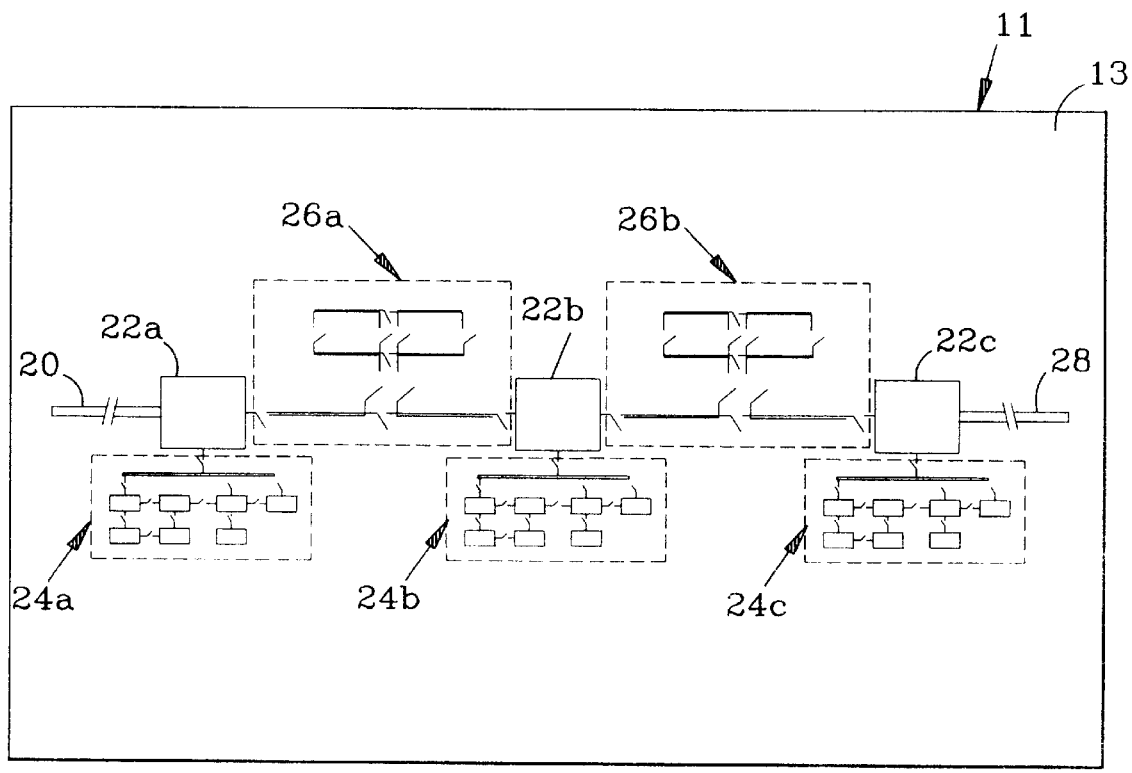
FIG. 3a is a simplified plan view of a microwave filter formed by connecting a plurality of capacitor and inductor networks of FIGS. 1 and 2a with a plurality of switches.
Figure 3B:
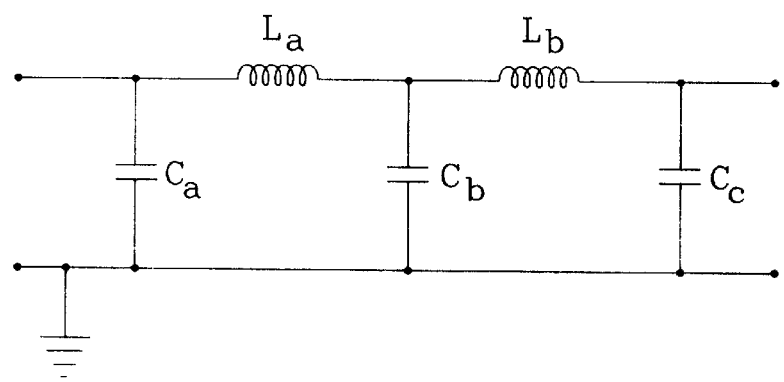

FIG. 3a shows still another embodiment of the invention in which a tunable filter combines the capacitor and inductor networks along the lines of FIGS. 1 and 2a. An input transmission line 20 is connected to a binary weighted capacitor 22a with a capacitance value $C_2$, and the capacitor 22a is connected to a capacitor network 24a that is similar to FIG. 2a and includes a plurality of MEM switches to adjust the network's capacitance. The capacitor 22a is connected to an inductor circuit 26a that is similar to FIG. 1. A filter is formed by repeating the structure of alternately connected capacitors 22a, 22b, 22c, the respective capacitor networks 24a, 24b, 24c and the inductor networks 26a, 26b. The filter's output signal is transmitted from the capacitor 22c to an output transmission line 28. The equivalent circuit of FIG. 3a is shown in FIG. 3b, in which the capacitances $C_a$, $C_b$ and $C_c$ are the sums of the capacitance values of the capacitors 22a, 22b and 22c and the tunable capacitor networks 24a, 24b and 24c, respectively. The inductances $L_a$ and $L_b$ are the inductance values of the tunable inductive line networks 26a and 26b, respectively. Each of the capacitance values $C_a$, $C_b$ and $C_c$ and the inductance values $La$ and $Lb$, which together determine the frequency response of the filter, can be changed by selectively switching at least some of the MEM switches within the capacitor and inductor networks. The filter is tuned to a desired frequency response by closing some of the switches while opening others. FIGS. 3a and 3b illustrate only one filter configuration; other configurations are also feasible.

Figure 4A:
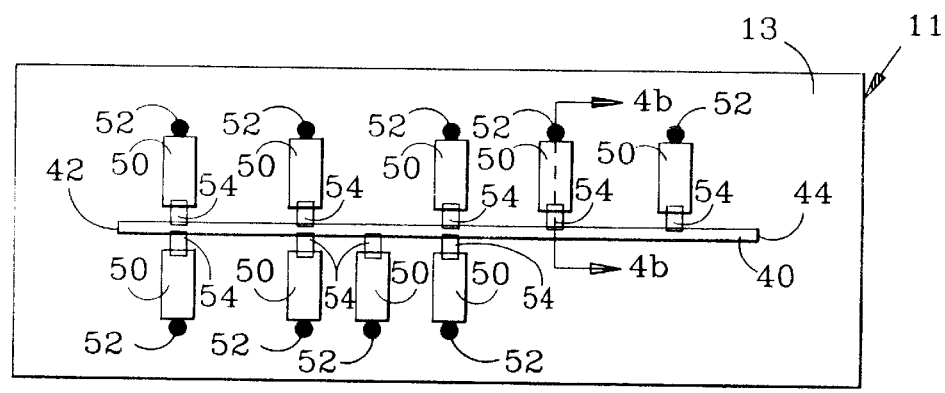
FIG. 4a is a simplified plan view of a transmission line segment with shunt stubs connected to it via MEM switches at different locations.

FIG. 4a shows an impedance matching network with a main transmission line segment 40 having an input 42 and an output 44. The network is implemented on the substrate 13 of a microwave circuit 11, which also includes a ground plane beneath the substrate to form a complete transmission line circuit. The transmission line 40 has a characteristic impedance, which is generally real and is substantially frequency independent. The impedance of a load at the output 44 may have a value different from that of the transmission line's characteristic impedance, and may even be complex if the load has a capacitive and/or an inductive component. If the characteristic impedance of the transmission line is different from the load impedance and the effective electrical line length is not properly tuned, a mismatch occurs and the input 42 is subjected to a voltage and/or current reflection from the network. Similarly, if there is a mismatch between the transmission line's characteristic impedance and the input impedance at the input 42, the output 44 is subjected to a reflection. The reflected waves interfere with desired microwave transmission, reduce transmission efficiency and cause undesired resonance along the transmission line.

The impedance mismatch is frequency-dependent for a fixed effective electrical line length. The mismatch within a selected frequency range can be reduced to produce a desired frequency response by connecting one or more shunt stubs of predetermined lengths at selected locations along the transmission line. Since conventional tuning by continuously adjusting the length of a shunt stub is infeasible in spacecraft applications, shunt stubs of fixed lengths must be provided. To obtain a desired effective electrical length for the transmission line, a plurality of shunt stubs 50 are preferably positioned on the substrate 13 on one or both sides of the transmission line 40. Each shunt stub has a termination 52 which can be either open or short circuited. On a MMIC or a MIC substrate, it is preferred that the shunt stubs have open-circuit terminations so that no connections between the stubs and the ground plane need to be provided. Short-circuit termination on a MMIC or a MIC requires a conductor that penetrates through the substrate to electrically connect the shunt stub to the ground plane, and therefore would be more difficult to manufacture. However, a short circuit is able to provide a more stable termination in a wide frequency range and is therefore desirable in some applications.

Each shunt stub 50 is connected to the main transmission line 40 via a respective MEM switch 54. By selectively closing MEM switches to some of the shunt stubs while opening others, a desired frequency response for the transmission line can be obtained to reduce the impedance mismatch within a desired frequency range. The spacing between MEM switches for adjacent shunt stubs along the transmission line is preferably about one-quarter of a wavelength, or an integral multiple of one-quarter wavelength. The length of each shunt stub is preferably about one-half of a wavelength, or an integral multiple of one-half wavelength. Other combinations of shunt stub lengths and spacings are also feasible. The shunt stubs need not have the same length, and the spacings need not be the same.

Figure 4B:
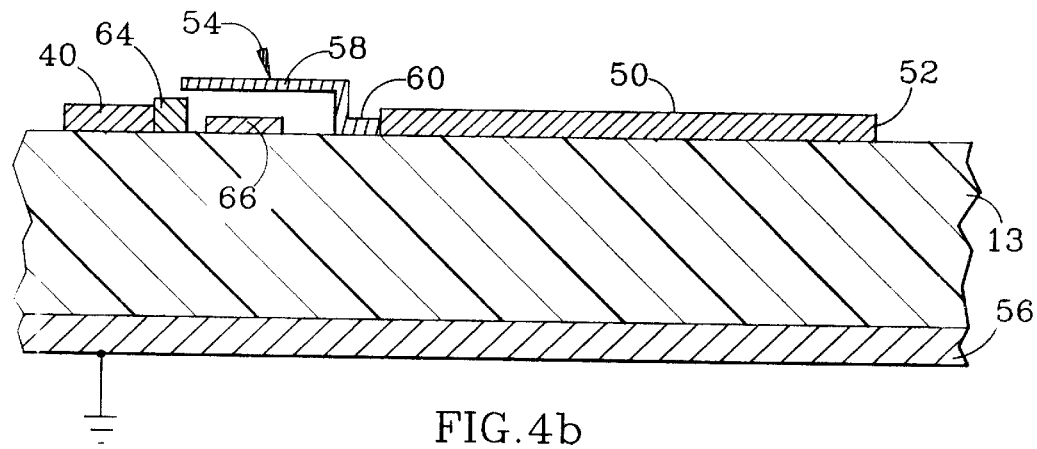
FIG. 4b is a sectional view taken along the section line 4b–4b of FIG. 4a, showing the connection of an open-circuit shunt stub with the transmission line segment via a MEM switch.

FIG. 4b shows a cross-sectional view along the section line 4b–4b, with the transmission line 40, the MEM switch 54 and the shunt stub 50 on the substrate 13. A common ground plane 56 is positioned beneath the substrate 13. The MEM switch has a movable cantilever beam arm 58, which has a fixed end anchored to a conductive switch pad 60 and a moving end that is adapted to connect electrically with a contact pad 64 when the switch is closed. The motion of the beam arm 58 is controlled by an activating voltage supplied to a switching electrode 66, which is located on the substrate 13 beneath the beam arm 58. The beam arm itself acts as another electrode that deforms and moves toward the switching electrode when an activating voltage appears on the switching electrode 66, so that the moving end touches the contact pad 64. The activating voltage is generally in the range of about 70–90 V. The contact pad 64 is connected to the transmission line 40, and the switch pad 60 is connected to the shunt stub 50, which has an open-circuit termination 52.

Figure 5:
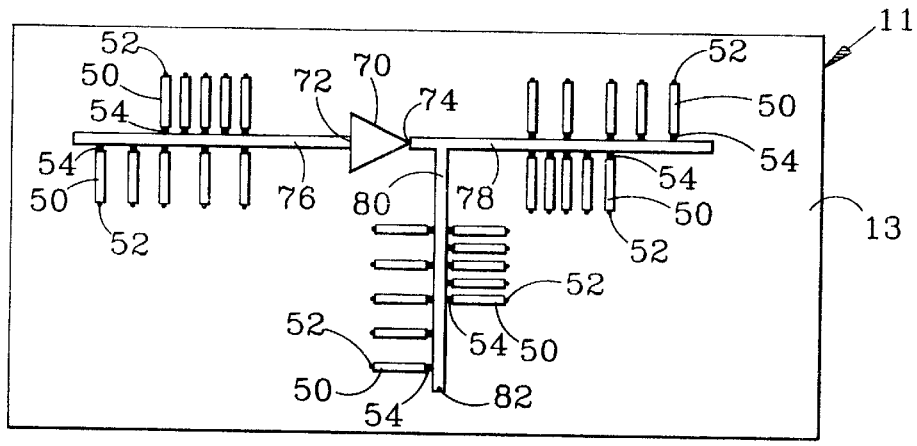
FIG. 5 is a simplified plan view of a microwave amplifier tuning network with MEM-switch-connected shunt stubs.

FIG. 5 shows an amplifier network on the substrate 13 of a microwave circuit 11. The circuit comprises a solid-state amplifier 70, which amplifies an input microwave signal from an input 72 and produces an amplified signal at an output 74. Most solid-state microwave amplifiers, especially power amplifiers, have a nonlinear transfer response characteristic which produces undesired harmonic output signals. The harmonic signals are generated at frequencies which are integral multiples of the fundamental frequency, that is, the frequency of the input signal. An input transmission line segment 76 is connected to feed the input signal to the amplifier input, and an output transmission line segment 78 is connected to the amplifier output to transmit the output signal. A harmonic tuning transmission line segment 80 that branches off from the output transmission line segment 78 is preferably provided for reducing the harmonics generated by the amplifier.

A plurality of shunt stubs 50 are connected to the input transmission line segment 76 via respective MEM switches 54 in a configuration similar to that shown in FIG. 4a. The shunt stubs preferably each have an open-circuit termination 52. The MEM switches are selectively turned on or off to match the input impedance, so that an input signal can be transmitted to the amplifier input 72 without being reflected back to the input line segment 76.

Similarly, the output transmission line segment 78 is also provided with a plurality of shunt stubs 50 connected via respective MEM switches 54 similar to FIG. 4a. The output impedance is matched by selective switching of at least some of the shunt stubs to reduce the reflection within a desired frequency range. Output impedance matching is important in that most solid-state microwave amplifiers are very sensitive to power reflected into the output end of the amplifier, and can be physically damaged or destroyed if the reflected power is high enough. Therefore, preventing reflection from the output line segment 78 into the amplifier output 74 is imperative to ensure safe amplifier operation. Additional shunt stubs and their associated MEM switches may be provided along the output line segment 78 to allow for fine tuning to further reduce the reflection to the amplifier output 74. The shunt stubs may have different lengths and different spacings to reduce the reflection over a desired frequency range.

The harmonic tuning transmission line segment 80 is connected to a plurality of shunt stubs 50 via respective MEM switches 54, which are selectively turned on or off to reduce the amplitudes of harmonic output signals. An amplifier may produce several harmonic frequency signals that must be suppressed, and the shunt stubs 50 with respective terminations 52 are arranged to prevent these signals from being transmitted to the output line segment 78. A properly tuned harmonic tuning line segment directs the harmonic signals to a load 82, which is preferably provided at the end of the harmonic tuning line segment 80 to absorb the energy of the harmonic signals, which will not be reflected back to the output line segment 78. The shunt stubs with different spacings and/or different lengths may be used to optimize the absorption of the harmonics of interest.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A microwave tuning network, comprising:

a substrate;

a transmission line on said substrate;

first and second arrays of microwave impedance components on said substrate; and an array of microelectromechanical (MEM) switches on said substrate connected to selectively determine the impedance values of said arrays of microwave impedance components to tune the impedance of said transmission line;

wherein said transmission line comprises input and output transmission lines on the surface of said substrate and a common ground plane underneath said substrate, and said first and second microwave impedance component arrays respectively comprise inductive lines and capacitive lines respectively connected between said input and output transmission lines, and between said input and output transmission lines and said ground plane, said first and second, arrays being connected by respective arrays of said MEM switches which are selectable to adjust the frequency response of said network to form a tunable filter.

2. A tunable microwave circuit, comprising:

a substrate;

a common ground plane underneath said substrate;

input and output transmission lines on said substrate;

at least one tunable inductive line network connected between said input and output transmission lines, said tunable inductive line network comprising an array of inductive lines that are interconnected by a plurality of microelectromechanical (MEM) switches which selectively connect said inductive lines to set the inductance value of said microwave circuit; and at least one tunable capacitor network connected between said input and output transmission lines and said ground plane, said tunable capacitor network comprising an array of capacitive lines that are interconnected by a plurality of MEM switches that are selectable to set the capacitance value of said microwave circuit.

3. A tunable microwave filter, comprising:

a substrate;

a common ground plane underneath said substrate;

input and output transmission lines on said substrate;

a plurality of capacitors with predetermined capacitance values connected in series between said input and output transmission lines;

a plurality of tunable inductive line networks connected between successive pairs of said capacitors, each said tunable inductive line network comprising an array of inductive lines that are interconnected by a plurality of selectable microelectromechanical (MEM) switches which connect said inductive lines to set the inductance value of said microwave filter; and a plurality of tunable capacitor networks connected between respective ones of said capacitors and said ground plane, each said tunable capacitor network comprising an array of capacitive lines that are interconnected by a plurality of selectable MEM switches which connect said capacitive lines to select the capacitance value of said microwave filter.

4. The tunable microwave filter of claim 3, wherein each said tunable capacitor network comprises:

a transmission line segment;

a plurality of binary weighted capacitors, each comprising a number of capacitance lines having a capacitance C and a number of MEM switches that selectively connect the capacitance lines to provide the binary weighted capacitance value;

a plurality of MEM switches that selectively interconnect the binary weighted capacitors;

a plurality of MEM switches that selectively connect respective binary weighted capacitors to said transmission line segment; and a MEM switch that connects the transmission line segment to a respective one of said capacitors having a predetermined capacitance value.

* * * * *